(12) United States Patent
Hashimoto et al.

(10) Patent No.: US 10,394,124 B2
(45) Date of Patent: Aug. 27, 2019

(54) RESIST UNDERLAYER FILM-FORMING COMPOSITION CONTAINING POLYMER HAVING ARYLENE GROUP

(71) Applicant: NISSAN CHEMICAL INDUSTRIES, LTD., Tokyo (JP)

(72) Inventors: Keisuke Hashimoto, Funabashi (JP); Rikimaru Sakamoto, Funabashi (JP); Hirokazu Nishimaki, Funabashi (JP); Takafumi Endo, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 3 days.

(21) Appl. No.: 15/520,133

(22) PCT Filed: Oct. 27, 2015

(86) PCT No.: PCT/JP2015/080217
§ 371 (c)(1),
(2) Date: Apr. 19, 2017

(87) PCT Pub. No.: WO2016/072316
PCT Pub. Date: May 12, 2016

(65) Prior Publication Data
US 2017/0315445 A1 Nov. 2, 2017

(30) Foreign Application Priority Data
Nov. 4, 2014 (JP) .................................. 2014-224514

(51) Int. Cl.
*G03F 7/11* (2006.01)
*G03F 7/16* (2006.01)
(Continued)

(52) U.S. Cl.
CPC ............... *G03F 7/11* (2013.01); *C08G 61/02* (2013.01); *C08G 61/12* (2013.01); *G03F 7/094* (2013.01);
(Continued)

(58) Field of Classification Search
CPC ... G03F 7/004; G03F 7/11; G03F 7/40; G03F 7/16; G03F 7/20; G03F 7/30;
(Continued)

(56) References Cited
U.S. PATENT DOCUMENTS

| 7,514,199 | B2* | 4/2009 | Uh .................. | G03F 7/0752 430/270.1 |
| 7,981,594 | B2* | 7/2011 | Yoon ................ | G03F 7/091 430/271.1 |
| 8,420,289 | B2* | 4/2013 | Kim ................. | G03F 7/091 430/270.1 |
| 9,589,788 | B2* | 3/2017 | Jung ................ | H01L 21/02118 |
| 9,695,279 | B2* | 7/2017 | Lee .................. | C08G 65/38 |
| 9,725,389 | B2* | 8/2017 | Kim ................. | G03F 7/094 |

(Continued)

FOREIGN PATENT DOCUMENTS

| JP | 2006-259249 A | 9/2006 |
| JP | 2007-178974 A | 7/2007 |

(Continued)

OTHER PUBLICATIONS

Jan. 26, 2016 Written Opinion of the International Searching Authority issued in International Patent Application No. PCT/JP2015/080217.

(Continued)

*Primary Examiner* — Mary A Wilczewski
(74) *Attorney, Agent, or Firm* — Oliff PLC

(57) ABSTRACT

A resist underlayer film-forming composition for lithography process having characteristics of enabling wafer surface planarization after film formation, excellent planarization performance on substrate with level difference, and good embeddability in fine hole pattern. The resist underlayer film-forming composition including polymer having unit structure of Formula (1) and solvent,

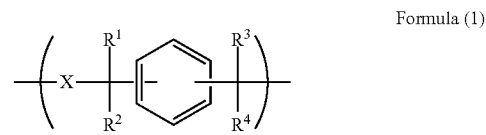

Formula (1)

wherein each of $R^1$ to $R^4$ is independently hydrogen atom or methyl group, and $X^1$ is divalent organic group having at least one arylene group optionally substituted by alkyl group, amino group, or hydroxyl group, and wherein $X^1$ in Formula (1) is organic group of Formula (2),

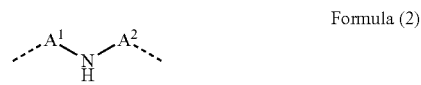

Formula (2)

wherein $A^1$ is phenylene group or naphthylene group, $A^2$ is phenylene group, naphthylene group, or organic group of Formula (3), and dotted line is bond, and

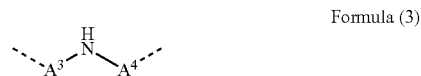

Formula (3)

wherein each of $A^3$ and $A^4$ is independently phenylene group or naphthylene group, and dotted line is bond.

6 Claims, No Drawings

(51) Int. Cl.
    *G03F 7/20*     (2006.01)
    *G03F 7/30*     (2006.01)
    *H01L 21/027*     (2006.01)
    *H01L 21/306*     (2006.01)
    *H01L 21/308*     (2006.01)
    *C08G 61/12*     (2006.01)
    *C08G 61/02*     (2006.01)
    *G03F 7/09*     (2006.01)
    *C09D 179/02*     (2006.01)

(52) U.S. Cl.
    CPC .................. *G03F 7/16* (2013.01); *G03F 7/20* (2013.01); *G03F 7/30* (2013.01); *H01L 21/0274* (2013.01); *H01L 21/3081* (2013.01); *H01L 21/30604* (2013.01); *C08G 2261/135* (2013.01); *C08G 2261/1422* (2013.01); *C08G 2261/3424* (2013.01); *C08G 2261/76* (2013.01); *C09D 179/02* (2013.01)

(58) Field of Classification Search
    CPC .. C08G 61/00; C08G 61/12; C08G 2261/135; H01L 21/027; H01L 21/0274; H01L 21/30604; H01L 21/0308; G08C 2261/1422; G08C 2261/3424; G08C 2261/76
    See application file for complete search history.

(56) References Cited

U.S. PATENT DOCUMENTS

| | | | |
|---|---|---|---|
| 9,996,007 B2* | 6/2018 | Jung | G03F 7/091 |
| 2006/0251990 A1 | 11/2006 | Uh et al. | |
| 2007/0059635 A1 | 3/2007 | Oh et al. | |
| 2007/0072111 A1 | 3/2007 | Oh et al. | |
| 2007/0148586 A1* | 6/2007 | Uh | G03F 7/0752 |
| | | | 430/270.1 |
| 2008/0160461 A1 | 7/2008 | Yoon et al. | |
| 2008/0305441 A1* | 12/2008 | Yoon | G03F 7/091 |
| | | | 430/323 |
| 2009/0176165 A1 | 7/2009 | Cheon et al. | |
| 2010/0021830 A1* | 1/2010 | Kim | G03F 7/091 |
| | | | 430/5 |
| 2010/0099044 A1* | 4/2010 | Hatakeyama | G03F 7/091 |
| | | | 430/285.1 |
| 2011/0117501 A1* | 5/2011 | Song | C08G 61/02 |
| | | | 430/315 |
| 2014/0319659 A1 | 10/2014 | Kwon et al. | |
| 2015/0004531 A1 | 1/2015 | Choi et al. | |
| 2015/0187566 A1* | 7/2015 | Park | H01L 21/0276 |
| | | | 257/499 |

FOREIGN PATENT DOCUMENTS

| | | | | |
|---|---|---|---|---|
| JP | 2010-122656 A | 6/2010 | | |
| JP | 2010-524224 A | 7/2010 | | |
| JP | 2010-528334 A | 8/2010 | | |
| JP | 2010-529499 A | 8/2010 | | |
| JP | 2011-107684 A | 6/2011 | | |
| KR | 10-0819162 B1 | 4/2008 | | |
| KR | 10-2011-0001215 A | 4/2009 | | |
| KR | 10-2015-0079199 A | 12/2013 | | |
| KR | 10-2015-0117174 A | 4/2014 | | |
| KR | 10-2014-0123368 A | 10/2016 | | |
| WO | 2008/120855 A | 10/2008 | | |
| WO | 2008/142546 A | 11/2008 | | |
| WO | 2008/150058 A | 12/2008 | | |
| WO | 2010/041626 A1 | 4/2010 | | |
| WO | 2011/065395 A1 | 6/2011 | | |
| WO | 2013/047516 A1 | 4/2013 | | |
| WO | WO 2014/024836 | * | 2/2014 | ............... G03F 7/11 |
| WO | WO 2016/072316 | * | 5/2016 | ............... G03F 7/11 |
| WO | WO 2018/235949 | * | 12/2018 | ............... G03F 7/11 |

OTHER PUBLICATIONS

Oct. 27, 2015 International Search Report of the International Searching Authority issued in International Patent Application No. PCT/JP2015/080217.

* cited by examiner

RESIST UNDERLAYER FILM-FORMING COMPOSITION CONTAINING POLYMER HAVING ARYLENE GROUP

TECHNICAL FIELD

The present invention relates to a resist underlayer film-forming composition for a lithography process which has a characteristic of enabling wafer surface planarization after film formation due to excellent planarization performance on a substrate with a level difference and good embeddability in a fine hole pattern.

BACKGROUND ART

In production of a semiconductor device, fine processing is carried out by a lithography process. The lithography process has a problem in which a resist pattern having a desired form is not formed during exposure of a resist layer on a substrate to an ultraviolet light laser such as a KrF excimer laser and an ArF excimer laser. The problem is caused by a standing wave due to reflection of the ultraviolet light laser on a surface of the substrate. In order to solve the problem, a resist underlayer film (anti-reflective coating) provided between the substrate and the resist layer is adopted. Use of a novolac resin as a composition for forming a resist underlayer film is known. For example, a photoresist underlayer film-forming material containing a resin having a repeating unit obtained by forming a novolac resin from a compound having a bisphenol group has been disclosed (Patent Document 1).

A spin coatable anti-reflective coating-forming composition containing a polymer having 3 or more fused aromatic rings in the backbone of the polymer has been disclosed (Patent Document 2).

A novolac resin using phenylnaphthylamine is used (Patent Document 3).

Use of such polymers as a dispersant has been proposed (Patent Document 4).

PRIOR ART DOCUMENTS

Patent Documents

Patent Document 1: Japanese Patent Application Publication No. 2006-259249 (JP 2006-259249 A)
Patent Document 2: Japanese Patent Application Publication No. 2010-528334 (JP 2010-528334 A)
Patent Document 3: international publication WO 2013/047516
Patent Document 4: International publication WO 2011/065395

SUMMARY OF THE INVENTION

Problem to be Solved by the Invention

A lithography process has been also known in which at least two resist underlayer films are formed and used as a mask material for a decrease in film thickness of a resist layer which is required due to miniaturization of a resist pattern. Examples of materials for forming the at least two layers include an organic resin (such as an acrylic resin and a novolac resin), a silicon resin (such as an organopolysiloxane), and an inorganic silicon compound (such as SiON and $SiO_2$). In recent years, a double patterning technology of performing lithography twice and etching twice to obtain one pattern has been widely applied. At each step, the aforementioned multilayer process for multilayers is used. In this case, an organic film to be formed after formation of a first pattern is required to have properties of planarizing level differences.

The present invention provides a resist underlayer film-forming composition for a lithography process which has a characteristic of enabling wafer surface planarization after film formation due to excellent planarization performance on a substrate with a level difference and good embeddability in a fine hole pattern.

Means for Solving the Problems

A first aspect of the present invention is a resist underlayer film-forming composition comprising a polymer having a unit structure of the following Formula (1):

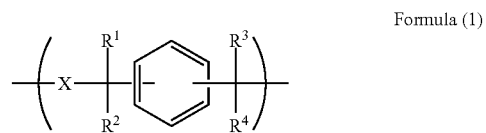

Formula (1)

(wherein each of $R^1$ to $R^4$ is independently a hydrogen atom or a methyl group, and $X^1$ is a divalent organic group having at least one arylene group optionally substituted by an alkyl group, an amino group, or a hydroxyl group), and a solvent.

A second aspect of the present invention is the resist underlayer composition according to the first aspect, wherein the arylene group defined by $X^1$ in Formula (1) is a phenylene group, a biphenylene group, a terphenylene group, a fluorenylene group, a naphthylene group, an anthrylene group, a pyrenylene group, or a carbazolylene group.

A third aspect of the present invention is the resist underlayer film-forming composition according to the first aspect, wherein $X^1$ in Formula (1) is an organic group of Formula (2):

Formula (2)

(wherein $A^1$ is a phenylene group or a naphthylene group, $A^2$ is a phenylene group, a naphthylene group, or an organic group of Formula (3):

Formula (3)

(wherein each of $A^3$ and $A^4$ is independently a phenylene group or a naphthylene group, and a dotted line is a bond), and a dotted line is a bond).

A fourth aspect of the present invention is the resist underlayer film-forming composition according to any one of the first to third aspects, further comprising a crosslinker.

A fifth aspect of the present invention is the resist underlayer film-forming composition according to any one of the first to fourth aspects, further comprising an acid and/or an acid generator.

A sixth aspect of the present invention is a resist underlayer film formed on a semiconductor substrate from a cured product of the resist underlayer film forming composition according to any one of the first to fifth aspects.

A seventh aspect of the present invention is a method for producing a semiconductor device comprising steps of forming an underlayer film on a semiconductor substrate from the resist underlayer film-forming composition according to any one of the first to fifth aspects, forming a resist film on the underlayer film, forming a resist pattern by irradiation with light or an electron beam and development, etching the underlayer film through the formed resist pattern, and processing the semiconductor substrate through the patterned underlayer film.

An eighth aspect of the present invention is a method for producing a semiconductor device comprising steps of forming an underlayer film on a semiconductor substrate from the resist underlayer film-forming composition according to any one of the first to fifth aspects, forming a hard mask on the underlayer film, forming a resist film on the hard mask, forming a resist pattern by irradiation with light or an electron beam and development, etching the hard mask through the formed resist pattern, etching the resist underlayer film through the patterned hard mask, and processing the semiconductor substrate through the patterned underlayer film.

Effects of the Invention

When a polymer used in the present invention is applied to a resist underlayer film for a lithography process, a resist underlayer film in which a surface of a wafer after film formation is planarized is obtained. This is because the planarization performance on a substrate with a level difference is excellent and the embeddability in a fine hole pattern is good.

The obtained resist underlayer film has high hardness, and, when the resist underlayer film is applied in the lithography process, wiggling of a pattern to be formed can be suppressed.

MODES FOR CARRYING OUT THE INVENTION

A resist underlayer film-forming composition of the present invention contains a polymer having a unit structure of Formula (1) and a solvent.

The resist underlayer film-forming composition may contain a crosslinker and an acid, and if necessary, may contain an additive such as an acid generator and a surfactant. A solid content of the composition is 0.1 to 70% by mass, 0.1 to 60% by mass, 0.2 to 30% by mass, or 0.3 to 15% by mass. Herein, the solid content is a content ratio of all components except for the solvent in the resist underlayer film-forming composition. The solid content may contain the polymer in a ratio of 1 to 100% by mass, 1 to 99.9% by mass, 50 to 99.9% by mass, 50 to 95% by mass, or 50 to 90% by mass.

The polymer used in the present invention has a weight average molecular weight of 600 to 1,000,000, 600 to 200,000, or 1,500 to 15,000.

In Formula (I), each of $R^1$ to $R^4$ is independently a hydrogen atom or a methyl group. $X^1$ is an organic group having at least one arylene group optionally substituted by an alkyl group, an amino group, or a hydroxyl group.

As the arylene group, an arylene group derived from a $C_{6-40}$ aryl group is preferably used. Examples of the arylene group include phenylene group, biphenylene group, terphenylene group, fluorenylene group, naphthylene group, anthrylene group, pyrenylene group, and carbazolylene group.

Examples of the alkyl group include $C_{1-10}$ alkyl groups, for example, methyl group, ethyl group, n-propyl group, isopropyl group, cyclopropyl group, n-butyl group, isobutyl group, s-butyl group, tert-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-isopropyl-cyclopropyl group, 2-isopropyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the amino group include primary, secondary, and tertiary amino groups. The secondary amino group may be preferably used.

An organic group in which $X^1$ in Formula (1) is represented by Formula (2) may be used.

In Formula (2), $A^1$ is a phenylene group or a naphthylene group, $A^2$ is a phenylene group, a naphthylene group, or an organic group of Formula (3), and a dotted line is a bond.

In Formula (3), each of $A^3$ and $A^4$ is independently a phenylene group or a naphthylene group, and a dotted line is a bond.

The polymer used in the present invention is a polymer of an aromatic methylene compound which is formed by a condensation reaction of an aromatic compound having hydroxymethyl group or a methoxymethyl group with an aromatic compound. For example, this reaction is carried out in the presence of an acid catalyst (e.g., p-toluenesulfonic acid) at a temperature of 100 to 150° C. for 10 to 20 hours. Examples of a solvent used in the reaction include propylene glycol monomethyl ether acetate (PGMEA).

Examples of the polymer used in the present invention include the followings:

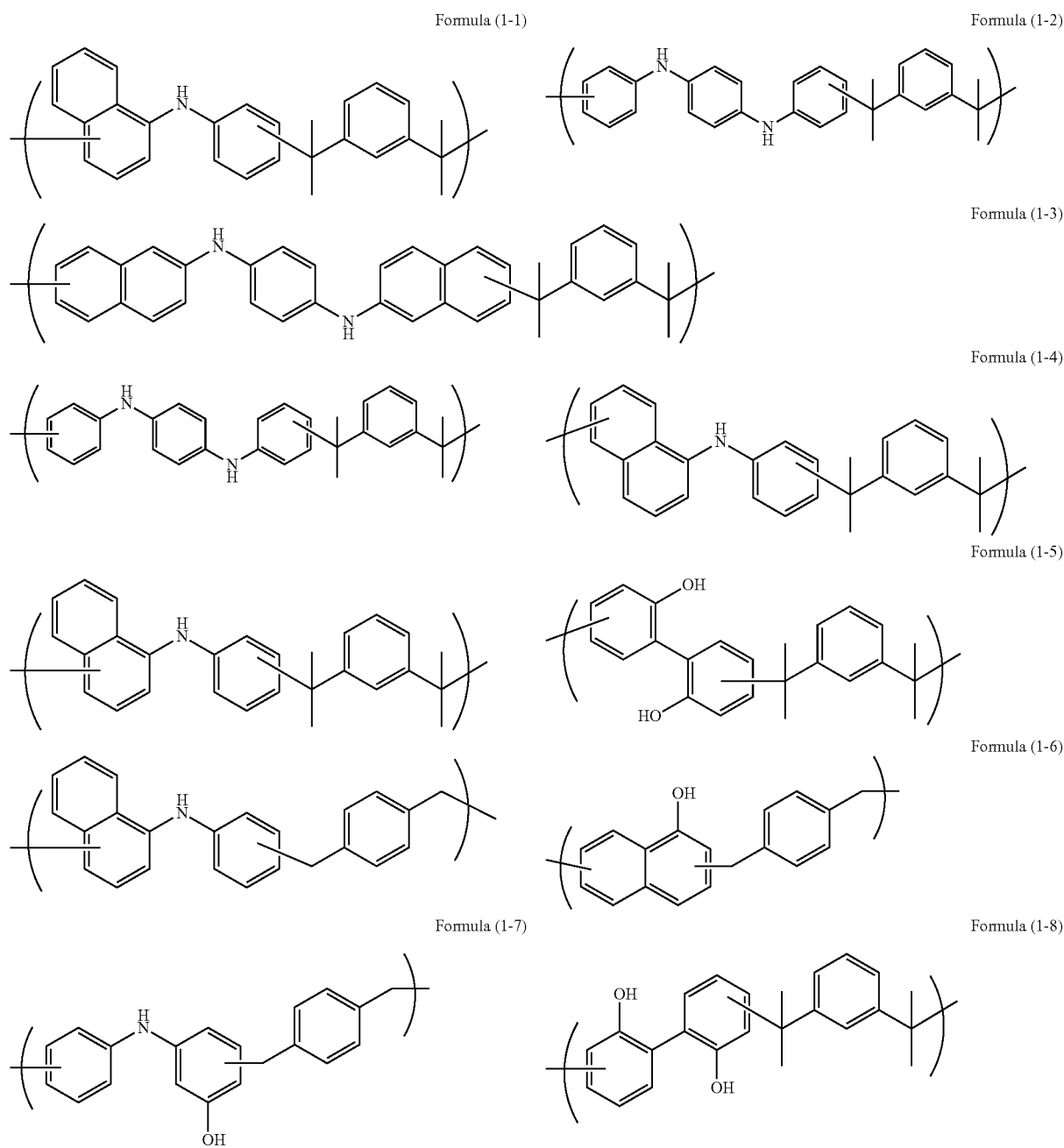

The resist underlayer film-forming composition of the present invention may further contain a crosslinker. As the crosslinker, a cross-linking compound having at least two crosslink-forming substituents is preferably used, Examples thereof include a melamine-based compound, a substituted urea-based compound, and a phenol-based compound which each have crosslink-forming substituents such as a methylol group and a methoxymethyl group. Specific examples thereof include methoxymethylated glycoluril and methoxymethylated melamine. Further examples thereof include tetramethoxymethyl glycoluril, tetrabutoxymethyl glycoluril, and hexamethoxymethyl melamine. In addition, examples of the substituted urea-based compound include tetramethoxymethyl urea and tetrabutoxymethyl urea.

Examples of the phenol-based compound include tetrahydroxymethyl biphenol, tetrahydroxymethyl biphenol, tetramethoxymethyl biphenol, and tetramethoxymethyl bisphenol.

As the crosslinker, a crosslinker having high heat resistance may be used. As the crosslinker having high heat resistance, a compound containing a crosslink-forming substituent having an aromatic ring (e.g., benzene ring and naphthalene ring) in the molecule may be preferably used.

Examples of the compound include compounds having a substructure of the following Formula (4), and polymers and oligomers which each have a repeating unit of the following Formula (5).

Formula (4)

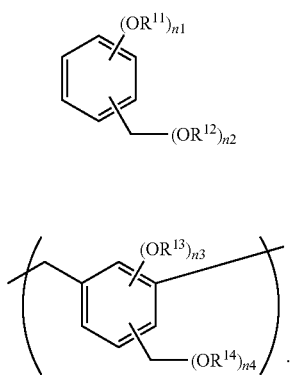

Formula (5)

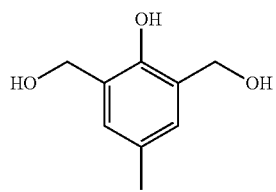

In the Formulae, each of $R^{11}$, $R^{12}$, $R^{13}$, and $R^{14}$ is independently a hydrogen atom or a $C_{1-10}$ alkyl group, and as the alkyl group, the aforementioned examples may be used, n1 is an integer of 1 to 2, n2 is an integer of 1 to (6-n1), n3 is an integer of 1 to 2, and n4 is an integer of 0 to (4-n3).

Examples of the compounds, polymers, and oligomers of Formulae (4) and (5) include the following Formulae (6-1) to (6-27). In the following Formulae, Me is a methyl group.

Formula (6-1)

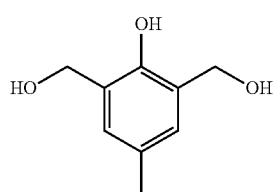

Formula (6-2)

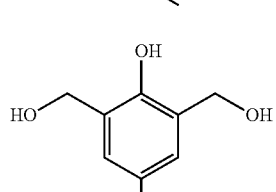

Formula (6-3)

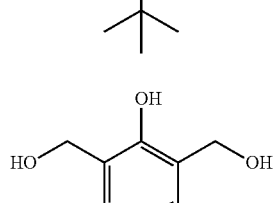

Formula (6-4)

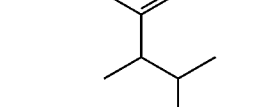

Formula (6-5)

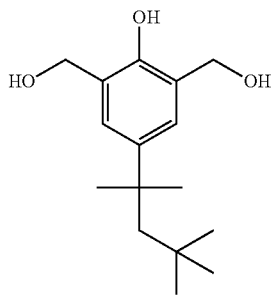

Formula (6-6)

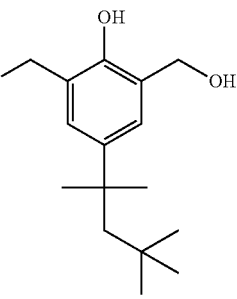

Formula (6-7)

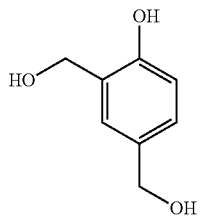

Formula (6-8)

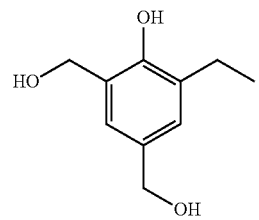

Formula (6-9)

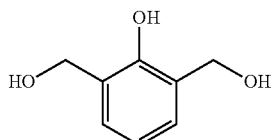

Formula (6-10)

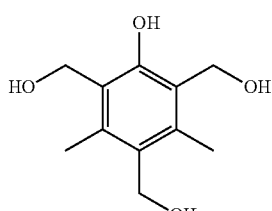

Formula (6-11)

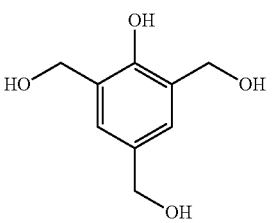

Formula (6-12)
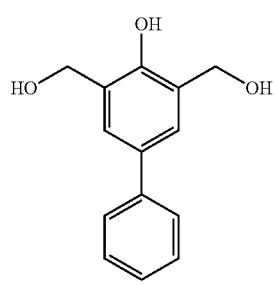
Formula (6-13)
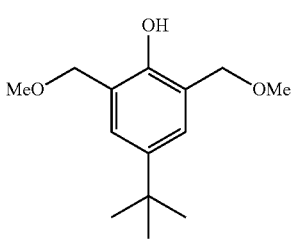
Formula (6-14)
Formula (6-15)
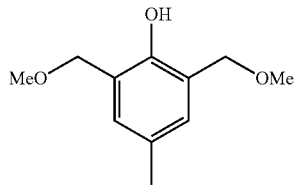
Formula (6-16)
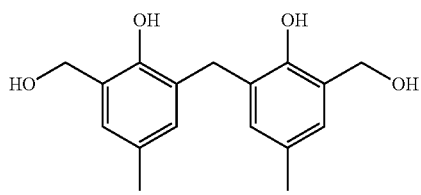
Formula (6-17)
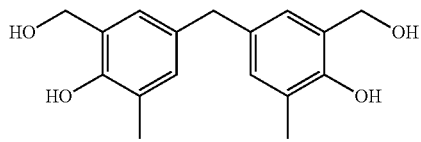
Formula (6-18)
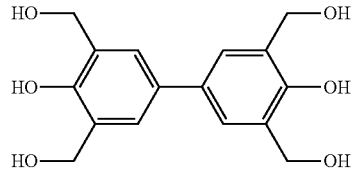
Formula (6-19)
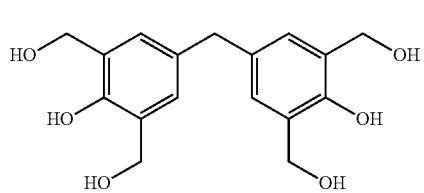
Formula (6-20)
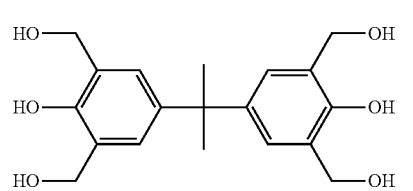
Formula (6-21)
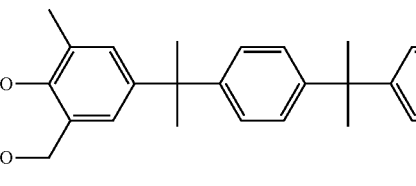
Formula (6-22)
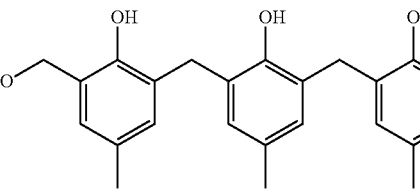
Formula (6-23)
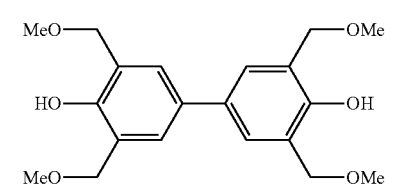
Formula (6-24)
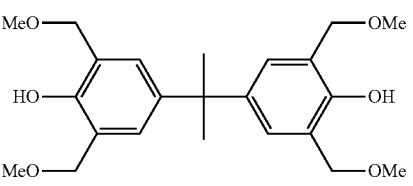
Formula (6-25)
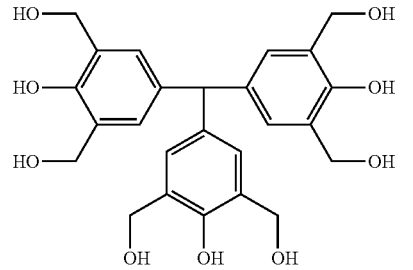

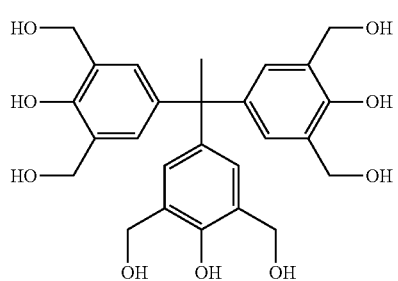

Formula (6-26)

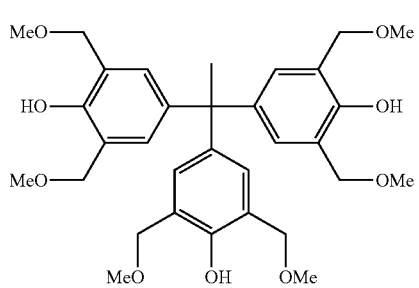

Formula (6-27)

These compounds may be obtained as products available from Asahi Organic Chemicals industry Co, Ltd., and Honshu Chemical Industry Co., Ltd. Among the crosslinkers, for example, the compound of Formula (6-23) may be obtained as 3,3',5,5'-tetramethoxymethyl-4,4'-dihydroxybiphenyl, TMOM-BP (trade name) available from Honshu Chemical Industry Co., Ltd. The compound of Formula (6-24) may be obtained as TM-BIP-A (trade name) available from Asahi. Organic Chemicals Industry Co., Ltd.

As the crosslinker, a compound having at least two epoxy groups may be used. Examples of such a compound include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexanedicarboxylic acid diglycidyl ester, 4,4'-methylene bis(N,N-diglycidylaniline), 3,4-epoxycyclohexylmethyl-3,4-epoxycyclohexanecarboxylate, trimethylol ethane triglycidyl ether, bisphenol-A-diglycidyl ether, EPOLEAD (registered trademark) GT-401, GT-403, GT-301, and GT-302, and CELLOXIDE (registered trademark) 2021 and 3000 available from Daicel Corporation, 1001, 1002, 1003, 1004, 1007, 1009, 1010, 828, 807, 152, 154, 180S75, 871, and 872 available from Mitsubishi Chemical Corporation, EFPN201, and 202, and EOCN-102, 103S, 104S, 1020, 1025, and 1027 available from NIPPON KAYAKU Co., Ltd., Denacol (registered trademark) EX-252, EX-611, EX-612, EX-614, EX 622, EX-411, EX-512, EX-522, EX-421, EX 313, EX-314, and EX-321 available from Nagase ChemteX Corporation, CY175, CY177, CY179, CY182, CY184, and CY192 available from BASF Japan. Ltd., and EPICLON 200, 400, 7015, 835LV, and 850CRP available from DIC Corporation. As the compound having at least two epoxy groups, an epoxy resin having an amino group may be further used. Examples of such an epoxy resin include YH-434 and YH-434L (available from NSCC Epoxy Manufacturing Co., Ltd.).

As the crosslinker, a compound having at least two blocked isocyanate groups may be used. Examples of the compound include TAKENATE (registered trademark) B-830 and B-870N available from Mitsui Chemicals, Inc., and VESTANAT (registered trademark) B1358/100 available from Evonik Degussa GmbH.

As the crosslinker, a compound having at least two vinyl ether groups may be used. Examples of such a compound include bis(4-(vinyloxymethyl)cyclohexylmethyl) glutarate, tri(ethylene glycol) divinyl ether, adipic acid divinyl ester, diethylene glycol divinyl ether, 1,2,4-tris(4-vinyloxybutyl) trimellitate, 1,3,5-tris(4-vinyloxybutyl) trimellitate, bis(4-(vinyloxy)butyl) terephthalate, bis(4-(vinyloxy)butyl) isophthalate, ethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylol ethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexane dimethanol divinyl ether.

One type selected from the crosslinkers may be added or two or more types may be added in combination. The content of the crosslinker is, for example, 2% by mass to 60% by mass relative to the solid content of the resist underlayer film-forming composition of the present invention except for the solvent described blow.

The resist underlayer film-forming composition of the present invention may further contain an acidic compound. The acidic compound serves as a catalyst of promoting a cross-linking reaction. Examples thereof include sulfonic acid and carboxylic acid compounds such as p-toluenesulfonic acid, trifluoromethanesulfonic acid, pyridinium p-toluenesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naplithalenesulfonic acid, citric acid, benzoic acid, and hydroxybenzoic acid, and inorganic acids such as hydrochloric acid, sulfuric acid, nitric acid, and phosphoric acid. Instead of or with the acidic compound, the resist underlayer film-forming composition may contain a thermal acid generator. The thermal acid generator also serves as the catalyst of promoting a cross-linking reaction. Examples thereof include quaternary ammonium salts of trifluoromethanesulfonic acid. One type selected from the acidic compounds and the thermal acid generators may be added or two or more types may be added in combination. The content of the acidic compound or the thermal acid generator is, for example, 0.1% by mass to 20% by mass relative to the solid content of the resist underlayer film-forming composition of the present invention except for the solvent described blow.

The resist underlayer film-forming composition of the present invention may further contain a surfactant. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorosurfactants including EFTOP (registered trademark) EF301, EF303, and EF352 (available from Mitsubishi Materials Electronic Chemicals Co., Ltd.), MEGAFACE (registered trademark) F171, F173, R30N, and R-40LM (available from DIC Corporation), Fluorad FC430 and FC431 (available from Sumitomo 3M, Ltd.), and Asahi Guard (registered trademark) AG710, and Surflon (registered trademark) S-382, SC101, SC102, SC103, SC104, SC105, and SC106 (available from Asahi Glass Co., Ltd.), and organosiloxane polymer KP341 (available from Shin-Etsu Chemical Co., Ltd.). One type selected from the surfactants may be added or two or more types may be added in combination. The content of the surfactant is, for example, 0.01% by mass to 5% by mass relative to the solid content of the resist underlayer film-forming composition of the present invention except for the solvent described blow.

The resist underlayer film-forming composition of the present invention can be prepared by dissolving the respective components in an appropriate solvent. The resist underlayer film-forming composition can be used in a homogeneous solution state. Examples of such a solvent include ethylene glycol monomethyl ether, ethylene glycol monoethyl ether, diethylene glycol monomethyl ether, diethylene glycol monoethyl ether, propylene glycol, propylene glycol monomethyl ether, propylene glycol monopropyl ether, propylene glycol monomethyl ether acetate, propylene glycol propyl ether acetate, methyl cellosolve acetate, ethyl cellosolve acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethyl formamide, N,N-dimethyl acetamide, and N-methylpyrrolidone. One type of the organic solvent may be used or two or more types thereof may be used in combination. The ratio of the solid content of the composition except for the organic solvent is, for example, 0.5% by mass to 30% by mass, and preferably 0.8% by mass to 15% by mass.

In the present invention, as a solvent capable of dissolving the polymer, the crosslinker component, the cross-linking catalyst, and the like, ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-buthanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl n-butyl ketone, isopropyl acetate ketone, n-propyl acetate, isobutyl acetate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-octanol, ethylene glycol, hexylene glycol, trimethylene glycol, 1-methoxy-2-buthanol, diacetone alcohol, furfuryl alcohol, tetrahydrofurfuryl alcohol, propylene glycol, benzyl alcohol, isopropyl ether, 1,4-dioxane, N,N-dimethyl formamide, N,N-dimethyl acetamide, N-methylpyrrolidone, 1,3-dimethyl-2-imidazolidinone, dimethyl sulfoxide, or N-cyclohexyl-2-pyrrolidinone may be used. The organic solvent may be used alone, or two or more types thereof may be used in combination.

Hereinafter, a method for forming a resist pattern using the resist underlayer film-forming composition of the present invention will be described. The resist underlayer film-forming composition is applied to a substrate used in production of a precision integrated circuit element (e.g., a transparent substrate such as a silicon/silicon dioxide coating, a glass substrate, and an ITO substrate) by an appropriate coating method using a spinner or a coater and thereafter the coated composition is baked and cured to form a coating-type underlayer film. The film thickness of the resist underlayer film is preferably 0.01 to 3.0 μm. A baking condition after coating is at 80 to 350° C., or preferably 100 to 400° C., for 0.5 to 120 minutes, or preferably 0.3 to 10 minutes. Subsequently, a resist is applied directly to the resist underlayer film, or if necessary, a resist is applied after one or more layers of coating material are formed on the coating-type underlayer film. Thereafter, the resist is irradiated with light or an electron beam through a predetermined mask, developed, rinsed, and dried to able to obtain a good resist pattern. If necessary, Post Exposure Bake (PEB) can be also carried out after irradiation with light or an electron beam. The resist underlayer film at a portion where the resist is developed and removed at the step described above can be removed by dry etching to form a desired pattern on the substrate.

The exposure light of the photoresist is actinic radiation such as near ultraviolet light, far ultraviolet light, and extreme ultraviolet light (e.g., EUV, wavelength: 13.5 nm). For example, light having a wavelength of 248 nm (KrF laser beam), 193 nm (ArF laser beam), or 157 nm (F2 laser beam) can be used. A method for light irradiation can be adopted without particular restriction as long as it is a method capable of generating an acid from a photoacid generator. The exposure dose is 1 to 2,000 mJ/cm$^2$, 10 to 1,500 mJ/cm$^2$, or 50 to 1,000 mJ/cm$^2$.

The electron beam irradiation to the electron beam resist can be carried out by, for example, using an electron beam irradiation device.

As a developer for a resist having a resist underlayer film formed from the resist underlayer film-forming composition for lithography of the present invention, aqueous solutions of alkalis including inorganic alkalis such as sodium hydroxide, potassium hydroxide, sodium carbonate, sodium silicate, sodium metasilicate, and ammonia water, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine may be used. To the aqueous solution of the alkali, an alcohol such as isopropyl alcohol or a surfactant such as a nonionic surfactant may be added in a proper amount and the obtained solution may be used. Among the developers, a quaternary ammonium salt is preferred, and tetramethylammonium hydroxide and choline are further preferred.

As the developer, an organic solvent may be used. Examples thereof include methyl acetate, butyl acetate, ethyl acetate, isopropyl acetate, amyl acetate, isoamyl acetate, ethyl methoxyacetate, ethyl ethoxyacetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol mono ethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. Further, a surfactant or the like may be added to the developer. A development condition is appropriately selected from a temperature of 5 to 50° C. and duration of 10 to 600 seconds.

In the present invention, a semiconductor device can be produced through steps of forming a resist underlayer film on a semiconductor substrate from the resist underlayer film-forming composition, forming a resist film on the resist underlayer film, forming a resist pattern by irradiation with light or an electron beam and development, etching the resist underlayer film through the formed resist pattern, and processing the semiconductor substrate through the patterned resist underlayer film.

As the resist pattern is further made finer, there are problems of resolution and collapse of the developed resist pattern. Therefore, a decrease in film thickness of the resist is desired. In this case, it is difficult that the resist pattern has a film thickness necessary for substrate processing. A process of imparting a function of a mask during the substrate processing to not only the resist pattern but also the resist underlayer film that is formed between the resist and the semiconductor substrate to be processed is required. As a resist underlayer film for such a process, differently from a conventional resist underlayer film having a high etching rate, a resist underlayer film for lithography having a selection ratio of dry etching rate close to that of the resist, a resist underlayer film for lithography having a smaller selection ratio of dry etching rate than that of the resist, and a resist underlayer film for lithography having a smaller selection ratio of dry etching rate than that of the semiconductor substrate are required. To such a resist underlayer film, an anti-reflective performance may be imparted. The resist underlayer film may have a function of a conventional anti-reflective coating.

On the other hand, in order to obtain a finer resist pattern, a process of making the resist pattern and the resist underlayer film finer than the pattern width during resist development by dry etching of the resist underlayer film begins to be also used. A resist underlayer film having a selection ratio of dry etching rate close to that of the resist, which is different from the conventional anti-reflective coating having a high etching rate, is required as the resist underlayer film for such a process. To such a resist underlayer film, the anti-reflective performance may be imparted. The resist underlayer film may have the function of the conventional anti-reflective coating.

In the present invention, the resist underlayer film of the present invention is formed on the substrate, and the resist may be applied directly to the resist underlayer film, or if necessary, the resist may be applied after one or more layers of coating material are formed on the resist underlayer film. In this case, even when the resist is thinly applied to prevent pattern collapse which is caused by a decrease in pattern width of the resist, the substrate can be processed by selection of appropriate etching gas.

Specifically, the semiconductor device can be produced through steps of forming the resist underlayer film on a semiconductor substrate from the resist underlayer film-forming composition, forming a hard mask from a coating material containing a silicon component or the like or a hard mask (e.g., from silicon nitride oxide) by vapor deposition on the resist underlayer film, forming a resist film on the hard mask, forming a resist pattern by irradiation with light or an electron beam and development, etching the hard mask through the formed resist pattern using a halogen-based gas, etching the resist underlayer film through the patterned hard mask using an oxygen-based gas or a hydrogen-based gas, and processing the semiconductor substrate through the patterned resist underlayer film using a halogen-based gas.

In consideration of an effect of the anti-reflective coating, a substance is not diffused in the photoresist during drying by heating since a light absorption portion is incorporated in the skeleton of the resist underlayer film-forming composition for lithography of the present invention. Further, the resist underlayer film-forming composition has a high reflective light prevention effect since the light absorption portion has sufficiently large light absorption properties.

The resist underlayer film-forming composition for lithography of the present invention has high heat stability, and can prevent pollution of film of a top layer by a decomposed substance during baking, and impart an extra margin of temperature at a baking step.

Depending on a process condition, a material for the resist underlayer film for lithography of the present invention can be used for a film having a function of preventing reflection of light, and, moreover, a function of preventing an interaction between the substrate and the photoresist or a bad influence on the substrate of a substance produced during exposure of the photoresist or a material used for the photoresist.

EXAMPLES

Weight average molecular weights and polydispersities shown in the following Synthesis Examples 1 to 8 and Comparative Synthesis Example 1 are based on results measured by gel permeation chromatography (hereinafter abbreviated as GPC in the specification). In the measurement, a GPC system manufactured by TOSOH CORPORATION was used, and measurement conditions are as follows.

GPC Column: TSK gel Super Multipore (registered trademark) Hz-N (TOSOH CORPORATION)
Column Temperature: 40° C.
Solvent: tetrahydrofuran (THE)
Flow rate: 0.35 mL/min
Standard sample: polystyrene (TOSOH CORPORATION)

Synthesis Example 1

In a 300 mL four-neck flask, α,α'-dihydroxy-1,3-diisopropyibenzene (28.79 g, 0.148 mol, available from Tokyo Chemical Industry Co., Ltd.), N-phenyl-1-naphthylamine (30.00 g, 0.1368 mol, available from Tokyo Chemical industry Co., Ltd.), and p-toluenesulfonic acid monohydrate (5.68 g, 0.029 mol, available from Tokyo Chemical Industry Co., Ltd.) were placed under nitrogen, and propylene glycol monomethyl ether acetate (hereinafter may be referred to as PGMEA) (150.43 g, available from KANTO CHEMICAL CO., INC.) was further placed. The mixture was stirred, and dissolved by increasing the temperature until reflux was confirmed. Thus, polymerization was initiated. After 16 hours, the resultant was left to cool down to 60° C. and reprecipitated in methanol (1,600 g, available from KANTO CHEMICAL CO., INC.). The obtained precipitate was filtered and dried at 60° C. for 16 hours by a reduced-pressure dryer to obtain a polymer (38.6 g) having a structural unit of Formula (1-1) as a target. The weight average molecular weight in terms of polystyrene of the obtained polymer was measured by GPC to be 2,000.

Synthesis Example 2

In a 500 mL four-neck flask, α,α'-dihydroxy-1,3-diisopropylbenzene (37.33 g, 0.1921 mol, available from. Tokyo Chemical Industry Co., Ltd.), N,N'-diphenyl-1,4-phenylenediamine (50.00 g, 0.1921 mol, available from Tokyo Chemical Industry Co., Ltd.), and p-toluenesulfonic acid monohydrate (1.53 g, 0.008 mol, available from Tokyo Chemical Industry Co., Ltd.) were placed under nitrogen, and propylene glycol monomethyl ether acetate (PGMEA) (207.33 g, available from KANTO CHEMICAL CO., INC.) was further placed. The mixture was stirred, and dissolved by increasing the temperature until reflux was confirmed. Thus, polymerization was initiated. After 16 hours, the resultant was left to cool down to 60° C. and reprecipitated in methanol (1,600 g, available from KANTO CHEMICAL CO., INC). The obtained precipitate was filtered and dried at 50° C. for 16 hours by a reduced-pressure dryer to obtain a polymer (56.04 g) having a structural unit of Formula (1-2) as a target. The weight average molecular weight in terms of polystyrene of the obtained polymer was measured by GPC to be 2,700.

Synthesis Example 3

In a 100-mL four-neck flask, α,α'-dihydroxy-1,3-diisopropylbenzene (3.23 g, 0.017 mol, available from Tokyo Chemical Industry Co., Ltd.), N,N'-di-2-naphthyl-1,4-phenylenediamine (6.00 g, 0.017 mol, available from Tokyo Chemical Industry Co., Ltd.), and p-toluenesulfonic acid monohydrate (0.50 g, 0.003 mol, available from Tokyo Chemical Industry Co., Ltd.) were placed under nitrogen, and propylene glycol monomethyl ether acetate (PGMEA) (22.70 g, available from KANTO CHEMICAL CO., INC.) was further placed. The mixture was stirred, and dissolved by increasing the temperature until reflux was confirmed. Thus, polymerization was initiated. After 16 hours, the resultant was left to cool down to 60° C. and reprecipitated in methanol (800 g, available from KANTO CHEMICAL CO., INC.). The obtained precipitate filtered and dried at 60° C. for 16 hours by a reduced-pressure dryer to obtain a polymer (5.8 g) having a structural unit of Formula (1-3) as a target. The weight average molecular weight in terms of polystyrene of the obtained polymer was measured by GPC to be 1,700.

Synthesis Example 4

In a 200-mL four-neck flask, α,α'-dihydroxy-1,3-diisopropylbenzene (5.97 g, 0.031 mot, available from Tokyo Chemical industry Co., Ltd.), N-phenyl-1-naphthylamine (3.37 g, 0.015 mol, available from Tokyo Chemical Industry Co., Ltd.), N,N-diphenyl-1,4-phenylenediamine (4.00 g, 0.015 mol, available from Tokyo Chemical. Industry Co., Ltd.), and p-toluenesulfonic acid monohydrate (0.25 g, 0.001 mol, available from Tokyo Chemical Industry Co., Ltd.) were placed under nitrogen, and propylene glycol monomethyl ether acetate (PGMEA) (31.70 g, available from KANTO CHEMICAL CO., INC.) was further placed. The mixture was stirred, and dissolved by increasing the temperature until reflux was confirmed. Thus, polymerization was initiated. After 16 hours, the resultant was left to cool down to 60° C. and reprecipitated in methanol (1,000 g, available from KANTO CHEMICAL CO., INC.), The obtained precipitate was filtered and dried at 60° C. for 16 hours by a reduced-pressure dryer to obtain a polymer (7.1 g) having a structural unit of Formula (1-4) as a target. The weight average molecular weight in terms of polystyrene of the obtained polymer was measured by GPC to be 2,800.

Synthesis Example 5

In a 100-mL four-neck flask, α,α'-dihydroxy-1,3-diisopropylbenzene (6.65 g, 0.034 mol, available from Tokyo Chemical Industry Co., Ltd.), N-phenyl-1-naphthylamine (3.68 g, 0.017 mol, available from Tokyo Chemical industry Co., Ltd.), 2,2-biphenol (3.00 g, 0.016 mol, available from Tokyo Chemical Industry Co., Ltd.), and p-toluenesulfonic acid monohydrate (1.34 g, 0.007 mol, available from Tokyo Chemical Industry Co., Ltd.) were placed under nitrogen, and propylene glycol monomethyl ether acetate (PGMEA) (34.23 g, available from KANTO CHEMICAL CO., INC.) was further placed. The mixture was stirred, and dissolved by increasing the temperature until reflux was confirmed. Thus, polymerization was initiated, After 16 hours, the resultant was left to cool down to 60° C. and reprecipitated in methanol (1,000 g, available from KANTO CHEMICAL CO., INC.). The obtained precipitate was filtered and dried at 60° C. for 16 hours by a reduced-pressure dryer to obtain a polymer (7.1 g) having a structural unit of Formula (1-5) as a target. The weight average molecular weight in terms of polystyrene of the obtained polymer was measured by GPC to be 2,800.

Synthesis Example 6

In a 100-mL four-neck flask, 1,4-bis(methoxymethyl)benzene (5.00 g. 0.030 mol, available from Tokyo Chemical Industry Co., Ltd.), N-phenyl-1-naphthylamine (3.23 g, 0.015 mol, available from Tokyo Chemical Industry Co., Ltd.), 1-naphtol (2.04 g, 0.014 mol, available from Tokyo Chemical Industry Co., Ltd.), and p-toluenesulfonic acid monohydrate (1.18 g, 0.006 mol, available from Tokyo Chemical Industry Co., Ltd.) were placed under nitrogen, and propylene glycol monomethyl ether acetate (PG MEA) (26.71 g, available from KANTO CHEMICAL CO., INC.) was further placed. The mixture was stirred, and dissolved by increasing the temperature until reflux was confirmed. Thus, polymerization was initiated. After 16 hours, the resultant was left to cool down to 60° C. and reprecipitated in methanol (1,000 g, available from KANTO CHEMICAL CO., INC.). The obtained precipitate was filtered and dried at 60° C. for 16 hours by a reduced-pressure dryer to obtain a polymer (7.6 g) having a structural unit of Formula (1-6) as a target. The weight average molecular weight in terms of polystyrene of the obtained polymer was measured by GPC to be 2,000.

Synthesis Example 7

In a 500-mL four-neck flask, 3-hydroxydiphenylamine (5.00 g, 0.324 mol, available from Tokyo Chemical Industry Co., Ltd.), 1,4-benzenedimethanol (44.76 g, 0.324 mol, available from Tokyo Chemical Industry Co., Ltd.), and methanesulfonic acid (6.23 g, 0.065 mol, available from Tokyo Chemical Industry Co., Ltd.) were placed under nitrogen, and propylene glycol monomethyl ether (hereinafter may be referred to as PGME) (206.11 g, available from KANTO CHEMICAL CO., INC.) was further placed. The mixture was stirred, and dissolved by increasing the temperature until reflux was confirmed. Thus, polymerization was initiated, After 17 hours, the resultant was left to cool down to 60° C. and reprecipitated in a mixed solvent of methanol (3,200 g, available from KANTO CHEMICAL CO., INC.) and pure water (800 g). The obtained precipitate was filtered and dried at 60° C. for 16 hours by a reduced-pressure dryer to obtain a polymer (62.9 g) having a structural unit of Formula (1-7) as a target. The weight average molecular weight in terms of polystyrene of the obtained polymer was measured by GPC to be 3,300.

Synthesis Example 8

In a 200-mL four-neck flask, 2,2-biphenol (5.00 g, 0.027 mol, available from Tokyo Chemical industry Co., Ltd.), α,α'-dihydroxy-1,3-diisopropylbenzene (5.97 g, 0.031 mol, available front Tokyo Chemical Industry Co., Ltd.), and p-toluenesulfonic acid monohydrate (1.09 g, 0.006 mol, available from Tokyo Chemical Industry Co., Ltd.) were placed under nitrogen, and propylene glycol monomethyl ether acetate (PGMEA) (26.88 g, available from KANTO CHEMICAL CO., INC.) was further placed. The mixture was stirred, and dissolved by increasing the temperature until reflux was confirmed. Thus, polymerization was initiated. After 16 hours, the resultant was left to cool down to 60° C. and reprecipitated in water/methanol at a ratio of 1/1 (1,000 g, available from KANTO CHEMICAL CO., INC.), The obtained precipitate was filtered and dried at 60° C. for 16 hours by a reduced-pressure dryer to obtain a polymer (7.6 g) having a structural unit of Formula (1-8) as a target. The weight average molecular weight in terms of polystyrene of the obtained polymer was measured by GPC to be 3,400.

Comparative Synthesis Example 1

In a 100-mL four-neck flask, carbazole (6.69 g, 0.040 mol, available from Tokyo Chemical Industry Co., Ltd.), 9-fluorenone (7.28 g, 0.040 mol, available from Tokyo Chemical Industry Co., Ltd.), and p-toluenesulfonic acid monohydrate (0.76 g, 0.0040 mol, available from Tokyo Chemical Industry Co., Ltd.) were placed under nitrogen, and 1,4-dioxane (6.69 g, available from KANTO CHEMICAL CO., INC.) was further placed. The mixture was stirred, and dissolved by increasing the temperature to 100° C. Thus, polymerization was initiated. After 24 hours, the resultant was left to cool down to 60° C., chloroform (34 g, available from KANTO CHEMICAL CO., INC,) was added for dilution, and reprecipitated in methanol (168 g, available from KANTO CHEMICAL CO., INC.). The obtained precipitate was filtered and dried at 80° C. for 24 hours by a reduced-pressure dryer to obtain a polymer (9.37 g) having a structural unit of the following Formula (7-1) as a target. The weight average molecular weight in terms of polystyrene of the obtained polymer was measured by GPC to be 2,800.

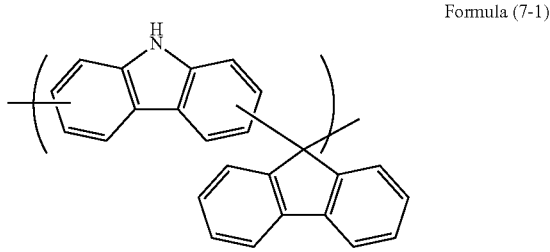

Formula (7-1)

Example 1

0.4 g of TMOM-BP (trade name, available from Honshu Chemical Industry Co., Ltd., Formula (6-23)) as a crosslinker, 0.05 g of pyridinium p-toluenesulfonate as a catalyst, and 0.003 g of MEGAFACE R-40LM (trade name, available from DIC Corporation) as a surfactant were mixed in 2.0 g of the polymer obtained in Synthesis Example 1, and the mixture was dissolved in 16.71 g of propylene glycol monomethyl ether acetate (PGMEA) and 4.18 g of propylene glycol monomethyl ether (PGME) to obtain a solution. Subsequently, the solution was filtered through a microfilter made of polyethylene with a pore diameter of 0.10 μm to prepare a resist underlayer film-forming composition used in lithography through a multilayer film.

Example 2

0.4 g of TMOM-BP (trade name, available from Honshu Chemical Industry Co., Ltd.) as a crosslinker, 0.06 g of pyridinium phenolsulfonate as a catalyst, and 0.004 g of MEGAFACE R-40LM (trade name, available from DIC Corporation) as a surfactant were mixed in 2.0 g of the polymer obtained in Synthesis Example 2, and the mixture was dissolved in 14.70 g of PGMEA, 4.44 g of PGME, and 4.44 g of cyclohexanone to obtain a solution. Subsequently, the solution was filtered through a microfilter made of polyethylene with a pore diameter of 0.10 μm to prepare a resist underlayer film-forming composition used in lithography through a multilayer film.

Example 3

0.4 g of TMOM-BP (trade name, available from Honshu Chemical industry Co., Ltd.) as a crosslinker, 0.06 g pyridinium phenolsulfonate as a catalyst, and 0.004 g of MEGAFACE R-40LM (trade name, available from DIC Corporation) as a surfactant were mixed in 2.0 g of the polymer obtained in Synthesis Example 3, and the mixture was dissolved in 13.31 g of PGMEA, 4.44 g of PGME, and 4.44 g of cyclohexanone to obtain a solution. Subsequently, the solution was filtered through a microfilter made of polyethylene with a pore diameter of 0.10 µm to prepare a resist underlayer film-forming composition used in lithography through a multilayer film.

Example 4

0.4 g of TMOM-BP (trade name, available from Honshu Chemical Industry Co., Ltd.) as a crosslinker, 0.06 g of pyridinium phenolsulfonate as a catalyst, and 0.004 g of MEGAFACE R-40LM (trade name, available from DIC Corporation) as a surfactant were mixed in 2.0 g of the polymer obtained in Synthesis Example 4, and the mixture was dissolved in 15.52 g of PGMEA and 6.65 g of PGME to obtain a solution. Subsequently, the solution was filtered through a microfilter made of polyethylene with a pore diameter of 0.10 µm to prepare a resist underlayer film-forming composition used in lithography through a multilayer film.

Example 5

0.4 g of TMOM-BP (trade name, available from Honshu Chemical Industry Co., Ltd.) as a crosslinker, 0.06 g of pyridinium phenolsulfonate as a catalyst, and 0.004 g of MEGAFACE R-40LM (trade name, available from DIC Corporation) as a surfactant were mixed in 2.0 g of the polymer obtained in Synthesis Example 5, and the mixture was dissolved in 15.52 g of PGMEA and 6.65 g of PGME to obtain a solution. Subsequently, the solution was filtered through a microfilter made of polyethylene with a pore diameter of 0.10 µm to prepare a resist underlayer film-forming composition used in lithography through a multilayer film.

Example 6

0.004 g MEGAFACE R-40LM (trade name, available from DIC Corporation) as a surfactant was mixed in 2.0 g of the polymer obtained in Synthesis Example 6, and the mixture was dissolved in 12.63 g of PGMEA and 5.41 g of PGME to obtain a solution. Subsequently, the solution was filtered through a microfilter made of polyethylene with a pore diameter of 0.10 µm to prepare a resist underlayer film-forming composition used in lithography through a multilayer film.

Example 7

0.3 g of TMOM-BP (trade name, available from Honshu Chemical Industry Co., Ltd.) as a crosslinker, 0.03 g of pyridinium phenolsulfonate as a catalyst, and 0.004 g of MEGAFACE R-40LM (trade name, available from DIC Corporation) as a surfactant were mixed in 2.0 g of the polymer obtained in Synthesis Example 7, and the mixture was dissolved in 12.60 g of PGMEA and 8.40 g of PGME to obtain a solution. Subsequently, the solution was filtered through a microfilter made of polyethylene with a pore diameter of 0.10 µm to prepare a resist underlayer film-forming composition used in lithography through a multilayer film.

Example 8

0.4 g of TMOM-BP (trade name, available from Honshu Chemical Industry Co., Ltd.) as a crosslinker, 0.06 g of pyridinium phenolsulfonate as a catalyst, and 0.004 g of MEGAFACE R-40LM (trade name, available from DIC Corporation) as a surfactant were mixed in 2.0 g of the polymer obtained in Synthesis Example 8, and the mixture was dissolved in 15.52 g of PGMEA and 6.65 g of PGME to obtain a solution. Subsequently, the solution was filtered through a microfilter made of polyethylene with a 2.0 pore diameter of 0.10 µm to prepare a resist underlayer film-forming composition used in lithography through a multilayer film.

Comparative Example 1

3.0 g of tetramethoxymethyl glycoluril as a crosslinker, 0.02 g of pyridinium p-toluenesulfonate as a catalyst, and 0.006 g of MEGAFACE R-40 (trade name, available from DIC Corporation) as a surfactant were mixed in 20 g of the polymer obtained in Comparative Synthesis Example 1, and the mixture was dissolved in 16.71 g of PGMEA and 4.18 g of PGME to obtain a solution. Subsequently, the solution was filtered through a microfilter made of polyethylene with a pore diameter of 0.10 µm to prepare a resist underlayer film-forming composition used in lithography through a multilayer film.

Measurement of Heat Resistance

The resist underlayer film-forming composition prepared in each of Examples 1 to 8 and Comparative Example 1 was applied to a silicon wafer using a spin coater. The silicon wafer was baked on a hot plate at 400° C. for 90 seconds to form a resist underlayer film (thickness: 0.2 µm). The resist underlayer film was scratched from the silicon wafer into a powder form. Thermal weight decrease of the obtained powder at 400° C. was measured using TG/DTA (TG-DTA2010SR manufactured by Bruker Corporation). The results are shown in Table 1.

TABLE 1

| Thermal weight decrease at 400° C. | | |
|---|---|---|
| Example 1 | 400° C. | 10% by mass or less |
| Example 2 | 400° C. | 10% by mass or less |
| Example 3 | 400° C. | 10% by mass or less |
| Example 4 | 400° C. | 10% by mass or less |
| Example 5 | 400° C. | 10% by mass or less |
| Example 6 | 400° C. | 10% by mass or less |
| Example 7 | 400° C. | 10% by mass or less |
| Comparative Example 1 | 400° C. | 10% by mass or less |

Embeddability and Planarization Property in Hole Substrate

For evaluation of planarization property and embeddability of a material, following wafers were produced using an ArF exposure device and dry etching, A pattern having holes with a hole diameter of 75 nm and a hole depth of 500 nm and spaces between the holes of 105 nm was formed on a TEOS wafer. The resist underlayer film-forming composition prepared in each of Examples 1 to 8 and Comparative Example 1 was applied to the TEOS wafer using a spin coater. The TEOS wafer was baked on a hot plate at 400° C. for 90 seconds to form a resist underlayer film (thickness: 220 nm). Subsequently, the cross section of the wafer was observed with an electron microscope. The thickness of the resist underlayer film at a hole crowded area of surface of the TEOS wafer was measured. The thickness at a flat area near the pattern area was also measured. The planarization property was converted into a number by the following expression on the basis of the obtained measured values.

Planarization property (%)={(thickness at flat area)−(thickness at hole area)}/(thickness at flat area)×100

A planarization property of 20% or less is considered as good, and a planarization property of more than 20% is considered as poor. The measurement results are shown in Table 2.

TABLE 2

Embeddability and Planarization Property in Hole Substrate

|  | planarization property (%) | Presence or absence of void |
|---|---|---|
| Example 1 | 2% | None |
| Example 2 | 13% | None |
| Example 3 | 12% | None |
| Example 4 | 10% | None |
| Example 5 | 19% | None |
| Example 6 | 19% | None |
| Example 7 | 12% | None |
| Example 8 | 20% | slightly |
| Comparative Example 1 | 16% | present |

It was found that the resist underlayer film-forming composition for a lithography process through a multilayer film of the present invention has such heat resistance that a hard mask can be formed on an upper layer by a CVD method. It was also found that the resist underlayer film-forming composition of the present invention has a good planarization performance due to good embeddability of a pattern with fine 75-nm holes and a significantly small difference in film thickness between the pattern and an area without the pattern.

INDUSTRIAL APPLICABILITY

The composition of the present invention has excellent planarization performance on a substrate with a level difference and good embeddability in a fine hole pattern. Therefore, the composition can be used as a resist underlayer film-forming composition for a lithography process enabling wafer surface planarization after film formation.

The invention claimed is:

1. A resist underlayer film-forming composition comprising:
a solvent; and
a polymer having a unit structure of the following Formula (1):

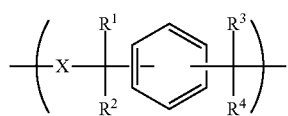

Formula (1)

where:
each of $R^1$ to $R^4$ is independently a hydrogen atom or a methyl group, and
$X^1$ is an organic group of Formula (2):

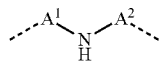

Formula (2)

where:
$A^1$ is a phenylene group or a naphthylene group,
a dotted line is a bond, and
$A^2$ is a phenylene group, a naphthylene group, or an organic group of Formula (3):

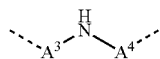

Formula (3)

where:
each of $A^3$ and $A^4$ is independently a phenylene group or a naphthylene group, and
a dotted line is a bond.

2. The resist underlayer film-forming composition according to claim 1, further comprising a crosslinker.

3. The resist underlayer film-forming composition according to claim 1, further comprising an acid and/or an acid generator.

4. A resist underlayer film formed on a semiconductor substrate, the resist underlayer film comprising a cured product of the resist underlayer film-forming composition according to claim 1.

5. A method for producing a semiconductor device comprising:
forming an underlayer film on a semiconductor substrate from the resist underlayer film-forming composition according to claim 1,
forming a resist film on the underlayer film,
forming a resist pattern by irradiation with light or electron beam and development,
etching the underlayer film through the formed resist pattern, and
processing the semiconductor substrate through the patterned underlayer film.

6. A method for producing a semiconductor device comprising:
forming an underlayer film on a semiconductor substrate from the resist underlayer film-forming composition according to claim 1,
forming a hard mask on the underlayer film,
forming a resist film on the hard mask,
forming a resist pattern by irradiation with light or electron beam and development,
etching the hard mask through the formed resist pattern,
etching the underlayer film through the patterned hard mask, and
processing the semiconductor substrate through the patterned resist underlayer film.

* * * * *